United States Patent [19]

Deutsch et al.

[11] Patent Number: 4,907,233
[45] Date of Patent: Mar. 6, 1990

[54] VLSI SINGLE-CHIP (255,223) REED-SOLOMON ENCODER WITH INTERLEAVER

[75] Inventors: Leslie J. Deutsch, Sepulveda; In-Shek Hsu; Trieu-Kie Truong, both of Pasadena; Irving S. Reed, Santa Monica, all of Calif.

[73] Assignee: The United States of America as represented by the Administrator of the National Aeronautics and Space Administration, Washington, D.C.

[21] Appl. No.: 195,226

[22] Filed: May 18, 1988

[51] Int. Cl.$^4$ .............................................. G06F 11/08
[52] U.S. Cl. .................................. 371/37.4; 371/38.1; 371/39.1; 371/41; 371/43
[58] Field of Search ....................... 371/37, 38, 39, 40, 371/41, 43, 44, 45

[56] References Cited

U.S. PATENT DOCUMENTS

| | | | |
|---|---|---|---|
| 3,831,143 | 8/1974 | Trafton | 371/39 |
| 3,988,677 | 10/1976 | Rice et al. | 371/40 |
| 4,162,480 | 7/1979 | Berlekamp | 371/37 |
| 4,410,989 | 10/1983 | Berlekamp | 371/40 |
| 4,649,541 | 3/1987 | Lahmeyer | 371/37 |

OTHER PUBLICATIONS

Odenwalder, Joseph P., "Concatenated Reed-Solomon/Viterbi Channel Coding for Advanced Planetary Missions: Analysis, Simulations, and Tests", Jet Propulsion Laboratory, Dec. 1, 1974.

IEEE Communications Magazine, Berlekamp, E., et al, "The Application of Error Control to Communications", vol. 25, No. 4, Apr. 1987, pp. 44-57.

Lin et al., "Error Control Coding", Prentice Hall, Inc., pub., 1983, pp. 271-272, 535-538.

R. L. Miller, L. J. Deutsch and S. A. Butman, "On the Error Statistics of Viterbi Decoding and the Performance of Concatenated Codes," Jet Propulsion Laboratory, Pasadena, California, Sep. 1, 1981.

R. F. Rice, "End-to-End Image Information Rate Advantages of Various Alternative Communication Systems," Publication 82-61, Jet Propulsion Laboratory, Pasadena, California, Sep. 1, 1982.

E. R. Berlekamp, "Bit-Serial Reed-Solomon Encoders," IEEE Trans. Inform. Theory, vol. IT-28, No. 6, pp. 869-874, Nov. 1982.

I. S. Hsu, I. S. Reed, T. K. Truong, K. Wang, C. S. Yeh and L. J. Deutsch, "The VLSI Implementation of a Reed-Solomon Encoder Using Berlekamp's Bit-Serial Multiplier Algorithm", IEEE Trans. on Computers, vol. C-33, No. 10, Oct. 1984.

*Primary Examiner*—Jerry Smith
*Assistant Examiner*—Stephen M. Baker
*Attorney, Agent, or Firm*—Thomas H. Jones; John R. Manning; Charles E. B. Glenn

[57] ABSTRACT

A concatenated coding system consisting of a (255,223) Reed-Solomon outer code and a convolutional inner code is provided with either a block of preinterleaved frames or an interleaver of frames in a block of data symbols to be coded in the outer decoder. By interleaving, errors are constrained to occur in only one symbol in a frame, which can be corrected by the Reed-Solomon outer decoder. After transmission and inner decoding, the data symbols are deinterleaved for outer decoding. Instead of preinterleaving at the source, or interleaving before inner encoding, the frames of data symbols may be interleaved at the receiver after inner decoding and then combined with the inner decoded check symbols for outer decoding. The outer encoder is a bit-serial Reed-Solomon encoder with programmable interleaving, and the inner decoder is a Viterbi decoder.

4 Claims, 6 Drawing Sheets

VLSI SINGLE-CHIP (255,223) REED-SOLOMON ENCODER WITH INTERLEAVER

ORIGIN OF THE INVENTION

The invention described herein was made in the performance of work under a NASA contract, and is subject to the provisions of Public Law 96-517 (35 USC 202) in which the Contractor has elected not to retain title.

TECHNICAL FIELD

The invention relates to a concatenated Reed-Solomon/convolutional encoding system consisting of a Reed-Solomon outer code and a convolutional inner code for downlink telemetry in space missions, and more particularly to a Reed-Solomon encoder with an interleaving capability of the information symbols and code correcting symbols in such a concatenated encoding system.

BACKGROUND ART

In the field of space communications, a convolutional code has been used by NASA's Voyager project for greater reliability in transmission of information. A Reed-Solomon (RS) code has also been used as a cyclic symbol error correcting code. And finally, a concatenated Reed-Solomon/convolutional encoding system has been adopted by the European Space Agency, National Aeronautics and Space Administration, and the Jet Propulsion Laboratory for the deep-space downlink. The performance of such a concatenated code scheme has been investigated by R. L. Miller, L. J. Deutsch and S. A. Butman, "On the Error Statistics of Viterbi Decoding and the Performance of Concatenated Codes," Jet Propulsion Laboratory, Pasadena, Calif., Sept. 1, 1981. It is shown that this concatenated channel provides a coding gain of almost 2 dB over a channel using only the convolutional code at a decoded bit error rate of $10^{-5}$.

One of the benefits of concatenated coding, and one of the main motivations for its adoption as a standard system, is that it provides for nearly error free communication links at fairly low signal power levels. This means that source data compression techniques can be used to help increase channel throughput without a substantial change in overall error rate. Data compression algorithms, while promising to remove substantial information redundancy are very sensitive to transmission errors. Study of a system using concatenated coding with data compression can be found in R. F. Rice, "End-to-End Image Information Rate Advantages of Various Alternative Communication Systems," Publication 82-61, Jet Propulsion Laboratory, Pasadena, Calif., Sept. 1, 1982.

A Reed-Solomon code is basically a polynomial code first presented in a paper by Irving S. Reed, et al., "Polynomial Codes Over Certain Finite Field," J. Soc. Industr. Appl. Math, Vol. 8, No. 2, pp. 300-304, June, 1960. For encoding, it is implemented by a circuit which performs polynomial division in a finite field. See U.S. Pat. No. 4,162,480 to Elwyn R. Berlekamp titled "Galois Field Computer." The major problem in designing a small encoder is the large quantity of hardware that is necessary. A conventional encoder for the (255, 223) RS code requires 32 finite field multipliers usually implemented as full parallel or table look-up multipliers. The use of either prohibits the implementation of the encoder on a single medium density VLSI chip.

Fortunately E. R. Berlekamp, "Bit-Serial Reed-Solomon Encoders," IEEE Trans. Inform. Theory, Vol. IT-28, No. 6, pp. 869-874, November 1982, describes a serial algorithm for finite field multiplication over a binary field. Berlekamp's algorithm requires only shifting and exclusive-OR operation. See also U.S. Pat. No. 4,410,989 titled "Bit Serial Encoder" to Berlekamp. Both references are incorporated herein by reference.

Recently, it has been known that this multiplication algorithm makes possible the design of a workable VLSI architecture and that a new dual-basis (255, 223) RS encoder can be realized readily on a single VLSI chip with NMOS technology. See I. S. Hsu, I. S. Reed, T. K. Truong, K. Wang, C. S. Yeh and L. J. Deutsch, "The VLSI Implementation of a Reed-Solomon Encoder Using Berlekamp's Bit-Serial Multiplier Algorithm," IEEE Trans. on Computers, Vol. C-33, No. 10, October 1984. This technical paper is also incorporated herein by reference.

In a concatenated coding system, inner decoder errors may occur in bursts, which are occasionally as long as several constraint lengths. The outer RS decoder remains undisturbed by errors which occur within a given 8-bit symbol (about one constraint length of the convolutional inner code). However, performance of the RS decoder is degraded by longer burst errors, i.e., errors occurring among successive symbols, as may occur in the operation of the inner decoder. As a consequence, interleaving the RS outer code is required for best performance, i.e., for preventing or minimizing correlated errors among successive symbols in the Viterbi inner decoder, as has been studied and reported by Joseph P. Odenwalder in a Final Report distributed by Linkabit Corporation of San Diego, Calif., under a contract for Jet Propulsion Laboratory dated Dec. 1, 1974, titled "Concatenated Reed-Solomon/Viterbi Channel Coding for Advanced Planetary Missions: Analysis, Simulations and Tests."

The concatenated coding system block diagram considered in that report included a symbol interleaving buffer in the transmitter and a symbol deinterleving buffer at the receiver generalized by FIG. 1 in this application. Interleaving is defined as dispersing the original sequence of symbols in an RS codeword or frame in a block of frames by reordering the sequence to include in the block the first symbol of every frame in the block followed by the second, third, etc., until all symbols of the block have been included. Deinterleaving is simply the inverse process. However, the process of interleaving would require too many components to be feasible for implementation on a single VLSI chip where that is required, that is in a system for communication from a spacecraft or a compact disk recorder, both of which may have a need for small size and/or weight, and high throughput which cannot tolerate the delays introduced by long leads interconnecting many chips.

STATEMENT OF THE INVENTION

Accordingly, it is an object of the invention to provide an architecture for a Reed-Solomon encoder with interleaving for a concatenated Reed-Solomon/convolutional encoding system that minimizes the components required.

A further object is to provide an interleaving RS encoder with a programmable depth of interleaving.

These and other advantages are achieved in accordance with the present invention in a concatenated Reed-Solomon/convolutional encoding system by preinterleaving information symbols received from a data source grouped into frames of, for example, 223 data symbols, and generating 32 check symbols in a Reed-Solomon encoder, or alternatively interleaving frames of information symbols to match the interleaving of the check symbols generated, either before encoding with a convolutional inner code prior to transmission through a channel, or after using a Viterbi decoder on the convolutional inner code at the receiver. In any of the alternatives, after convolutional inner code encoding, the concatenated Reed-Solomon/convolutional encoded information symbols are transmitted.

Interleaving of information symbols and of check symbols is achieved by entering N associated groups of each, such as N frames of 223 information symbols each and of 32 associated check symbols, in two sets of N registers in a column, one set for the information symbols, and the other set for the associated check symbols, and then reading out vertically for transmission of the first symbol of information in every register of the first set and second set, then the second symbol in every register, etc., until all of the symbols have been interleaved and transmitted. The process of convolutional inner code encoding of the interleaved symbols is then followed for transmission to a receiver in the usual manner. Instead of interleaving the information symbols at the transmitter, it is preferred to preinterleave the information symbols at the data source, or to interleave only the check symbols at the transmitter and interleave the data symbols after the Viterbi inner decoder at the receiver, to match the interleaving of the check symbols. These two preferred alternatives have the advantage of requiring the minimum that need be included in a VLSI chip at the transmitter. In any case, the RS outer code encoded symbols must then be deinterleaved at the receiver for decoding. In the case of interleaving at the receiver, the process of interleaving is inverted to deinterleave after RS outer code decoding. The receiver will normally be on the ground where space and weight is not a factor to be considered so that it is feasible to have both interleaving and deinterleaving at the receiver.

The novel features that are considered characteristic of this invention are set forth with particularlity in the appended claims. The invention will best be understood from the following description when read in connection with the accompanying drawings.

DETAILED DESCRIPTION OF THE INVENTION

Figure 1:
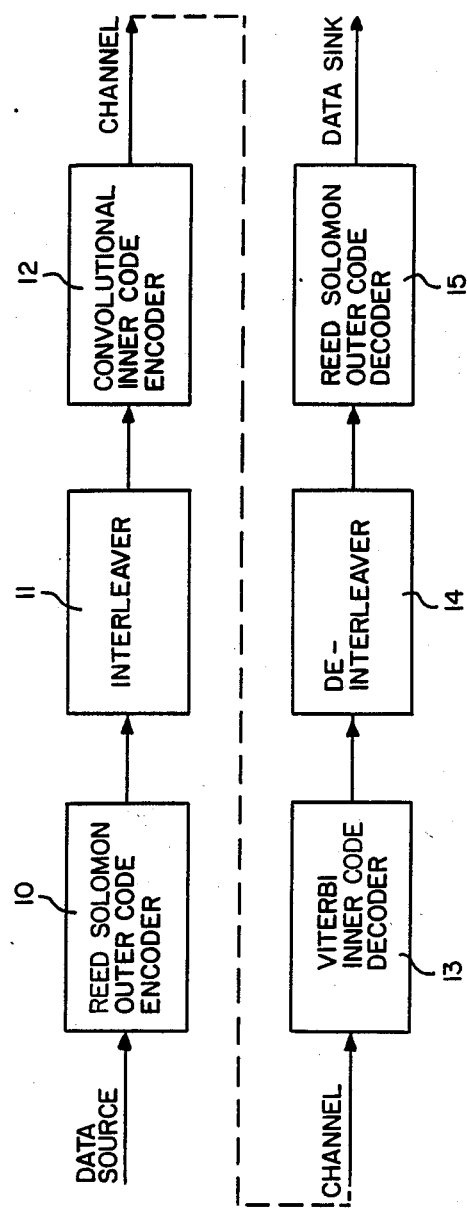
FIG. 1 illustrates in a general block diagram the prior art of the present invention.

A prior art block diagram of a concatenated coding system with interleaving is shown in FIG. 1 as having at the transmitter a Reed-Solomon outer code encoder 10, interleaver 11, and a convolutional inner code encoder 12, and at the receiver an inner code decoder 13, deinterleaver 14 and Reed-Solomon outer code decoder 15. The inner code decoder 13 at the receiver constitutes a Viterbi (maximum likelihood) decoder. The RS outer code encoder 10 and decoder 15 use a high rate block code. It is demonstrated by Miller, et al., supra, that this concatenated channel provides more than 2 dB of coding gain over the convolutional-only channel. However, the performance of the recommended Reed-Solomon coding scheme in the concatenated coding system can only be achieved when the bursts of errors appearing at the output of the Viterbi inner code decoder 13 are dispersed in such a manner that the RS symbols at the input of the outer decoder 15 are randomized sufficiently.

Before describing the first embodiment of this invention, the process of interleaving will be described with reference to the following table.

| SEQUENTIAL FRAME STORE | | Registers For Information Symbols | Registers For Check Symbols |
|---|---|---|---|
| → | Frame #1 | A 1, 2, . . . ,223 | A 1, . . . ,32 |
|   | Frame #2 | B 1, 2, . . . ,223 | B 1, . . . ,32 |
|   | . | . | . |
|   | . | . | . |
|   | . | . | . |
|   | Frame #5 | E 1, . . . ,223 | E 1, . . . ,32 |
| → | READ INTERLEAVED FRAMES | ↓ . . . ↓ | ↓ . . . ↓ |

The frames of symbols (five in this example) are grouped together forming one block. The scheme of interleaving five frames in a block of symbols from the RS outer code encoder 10 is referred to as interleaving to a depth of five frames. Assuming the numbers used in the table above represent a block of five frames of 223 information symbols plus 32 parity check symbols per frame, and the letters represent the association of the registers for the two sets of 223 and 32 associated symbols, it is evident that as information symbols are received, the parity check symbols generated are also stored in the same sequence of registers corresponding to the data registers. The process of interleaving and deinterleving follows in a coordinated manner using two blocks of registers, one for the information symbols processed to generate parity check symbols, and one for the check symbols generated. Once the information symbols are received sequentially, frame by frame, for example 5 frames, and stored in shift registers, and check symbols are generated frame by frame and stored in the second set of shift registers, they may be read out sequentially across (vertically) as shown in the above table.

Thus, as the information to be transmitted is received from a data source, the RS outer code encoder 10 processes the input data and outputs the RS code frames containing 255 symbols (223 information symbols and 32 check symbols). Each code frame of 255 symbols may be preinterleaved, or interleaved by storing in separate sets or banks of registers, two registers for each depth of interleaving, here shown as five, one set of registers for the information symbols, and the other set of register for the generated code symbols. The five code frames of 255 symbols form a block. Once the block of code words are stored, they are read out serially by column A1, B1, . . . , E1; A2, B2, . . . , E2; A3, B3, . . . , E3; etc., until all five code frames have been transmitted to the inner code encoder 12. That constitutes a block of interleaved RS coded data transmitted. In the case of having preinterleaved data from the source, the interleaver 11 simply generates the check symbols for the interleaved data in an interleaved form, as will be described for the preferred embodiment with reference to FIG. 2.

As a result of this interleaving, a burst error event of the Viterbi decoder 13 will tend to affect only one symbol of each frame depending on the length of the burst and the number of rows in each interleaving array of registers. This number of rows has been defined as the interleaving depth, shown as five in the table, but in the preferred embodiment described below with reference to FIG. 3, the interleaving depth is programmable to be from 2 to 5.

Figure 2:
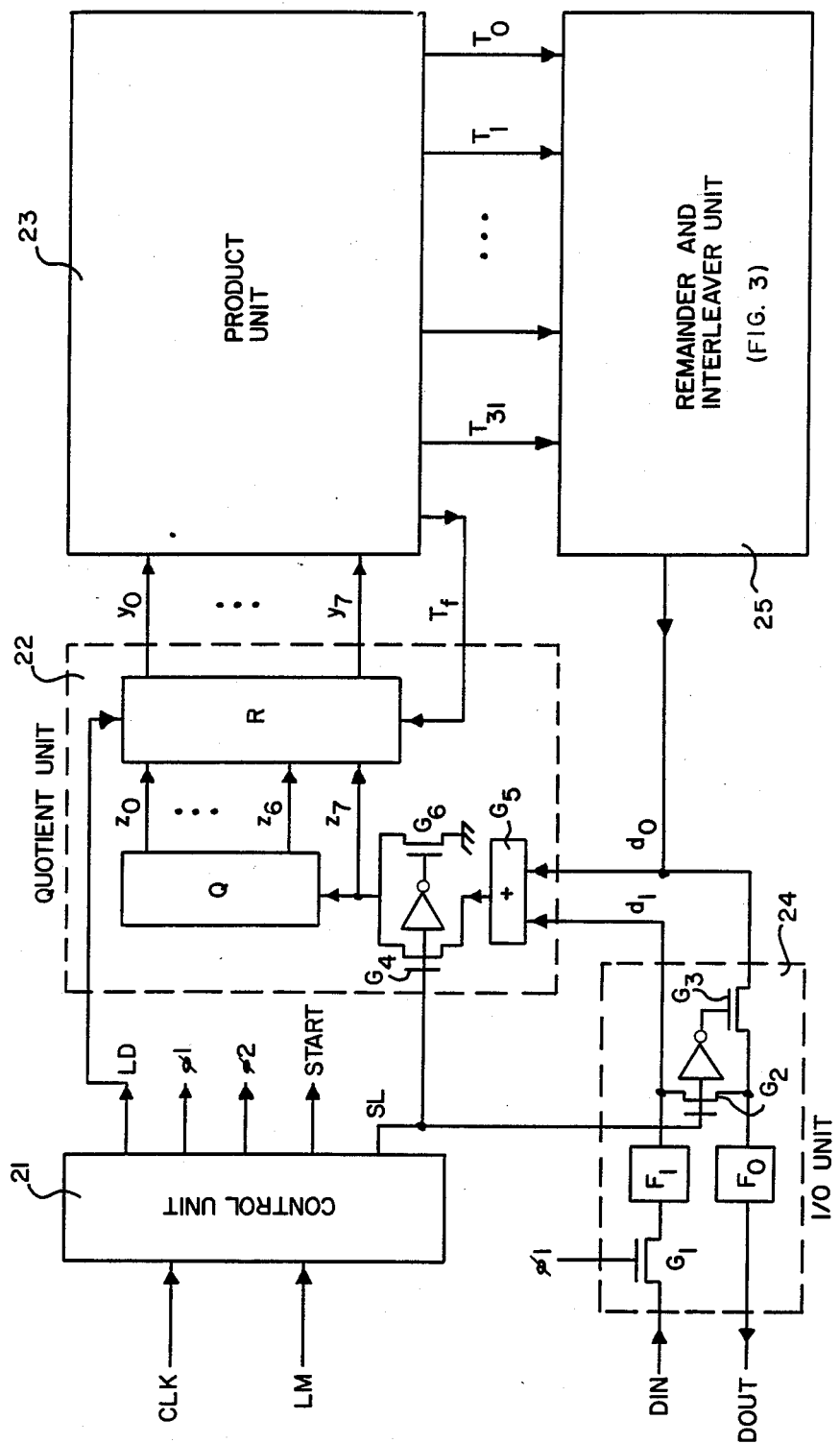
FIG. 2 illustrates a block diagram of a (255, 223) RS encoder having a remainder and an interleaver unit for a Reed-Solomon encoder embodying the present invention of interleaving parity check symbols generated for block information symbols.

Berlekamp's bit-serial multiplication algorithm for a (255, 223) RS encoder over GF ($2^8$) is presented by Hsu, et al., supra. A block diagram of the (255, 223) RS encoder of that paper is shown in FIG. 2 with the programmable interleaving depth shown in FIG. 3. The circuit of FIG. 2 is divided into five units: control unit 21, quotient unit 22, product unit 23, input/output (I/O) unit 24, and a remainder and interleaver unit 25, which contains storage for the remainder out of the product unit 23 for interleaved parity check symbols. The use of the remainder storage alone is explained in detail in Hsu, et al., for the special case of an interleaving depth of one; what is new in this embodiment is the feature of providing the remainder storage in the remainder and interleaver unit 25 differs from that in the paper by Hsu, et al., in that an interleaving function is included. Consequently, the unit 25 is called the "remainder and interleaver unit."

Before describing the remainder and interleaver unit 15 shown in FIG. 3, the architecture designed to realize a (255, 223) RS encoder using Berlekamp's multiplier algorithm will first be described with reference to FIG. 2, assuming that the depth of interleaving is one, i.e., assuming no interleaving. This description is taken from the paper by Hsu, et al., supra, at pp. 908, 909.

An RS code is a block sequence of Galois field symbols. Each symbol is a field element in GF($2^m$) where GF($2^m$) denotes the finite field of $2^m$ binary symbols. This sequence of symbols can be considered to be the coefficients of a polynomial. The code polynomial $C(x)$ of such a code is $C(x) = c_0 + c_1 x + \ldots + c_{n-1} x^{n-1}$ where $c_i \in GF(2^m)$.

The parameters of an RS code are summarized as follows:
- m = number of bits per symbol;
- n = $2^m - 1$ = the length of a codeword in symbols;
- t = maximum number of error symbols that can be corrected;
- d = 2t + 1 = design distance;
- 2t = number of check symbols;
- k = n − 2t = number of information symbols.

In the example of the present invention, m=8, n=255, t=16, d=33, 2t=32, and k=223. This is the (255,233) RS code. This particular code is capable of correcting a maximum of 16 symbol errors or 32 erasures.

The generator polynomial of an RS code is defined by $$g(x) = \sum_{j=b}^{b+2t-1} (x - \gamma^j) = \sum_{i=0}^{2t} g_i x^i \qquad (1)$$

where b is a nonnegative integer, often chosen to be 1, and $\gamma$ is a primitive element in GF($2^m$). In order to reduce the complexity of the encoder, it is desirable to make the coefficients of g(x) symmetric so that $g(x) = x^{-d-1} g(1/x)$. To accomplish this b must be chosen to satisfy $2b + d - 2 = 2^m - 1$. Thus, for the (255,223) RS code, b=112.

Let $I(x) = c_{2t} x^{2t} + c_{2t+1} x^{2t+1} + \ldots + c_{n-1} x^{n-1}$ and $P(x) = c_0 + c_1 x + \ldots + c_{2t-1} x^{2t-1}$ be the information polynomial and the check polynomial, respectively. Then the encoded RS code polynomial is represented by $$C(x) = I(x) + P(x) \qquad (2)$$

To be an RS code C(x) must be also a multiple of g(x). That is, $C(x) = q(x) g(x)$. The encoding process is to find P(x) from I(x) and g(x). This is achieved by the division algorithm. Dividing I(x) by g(x) yields $$I(x) = q(x) g(x) + r(x). \qquad (3)$$

If one lets $P(x) = -\gamma(x)$, then $q(x)g(x) = I(x) - \gamma(x) = I(x) + P(x) = C(x)$. Hence, C(x) is given by Equation (2) where $P(x) = -r(x)$.

Figure 3:
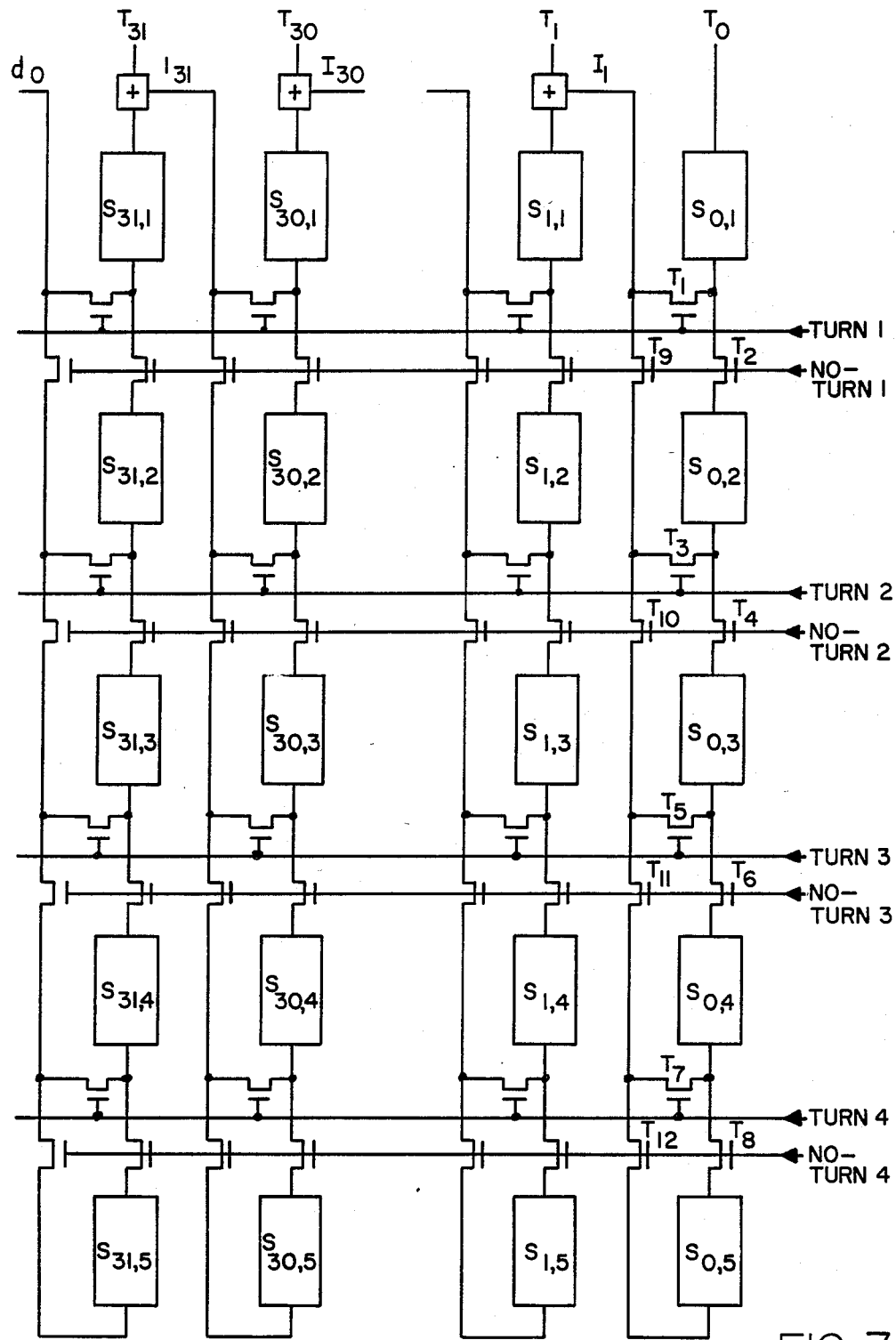
FIG. 3 illustrates a block diagram of the remainder and interleaver unit of FIG. 2.
Figure 4:
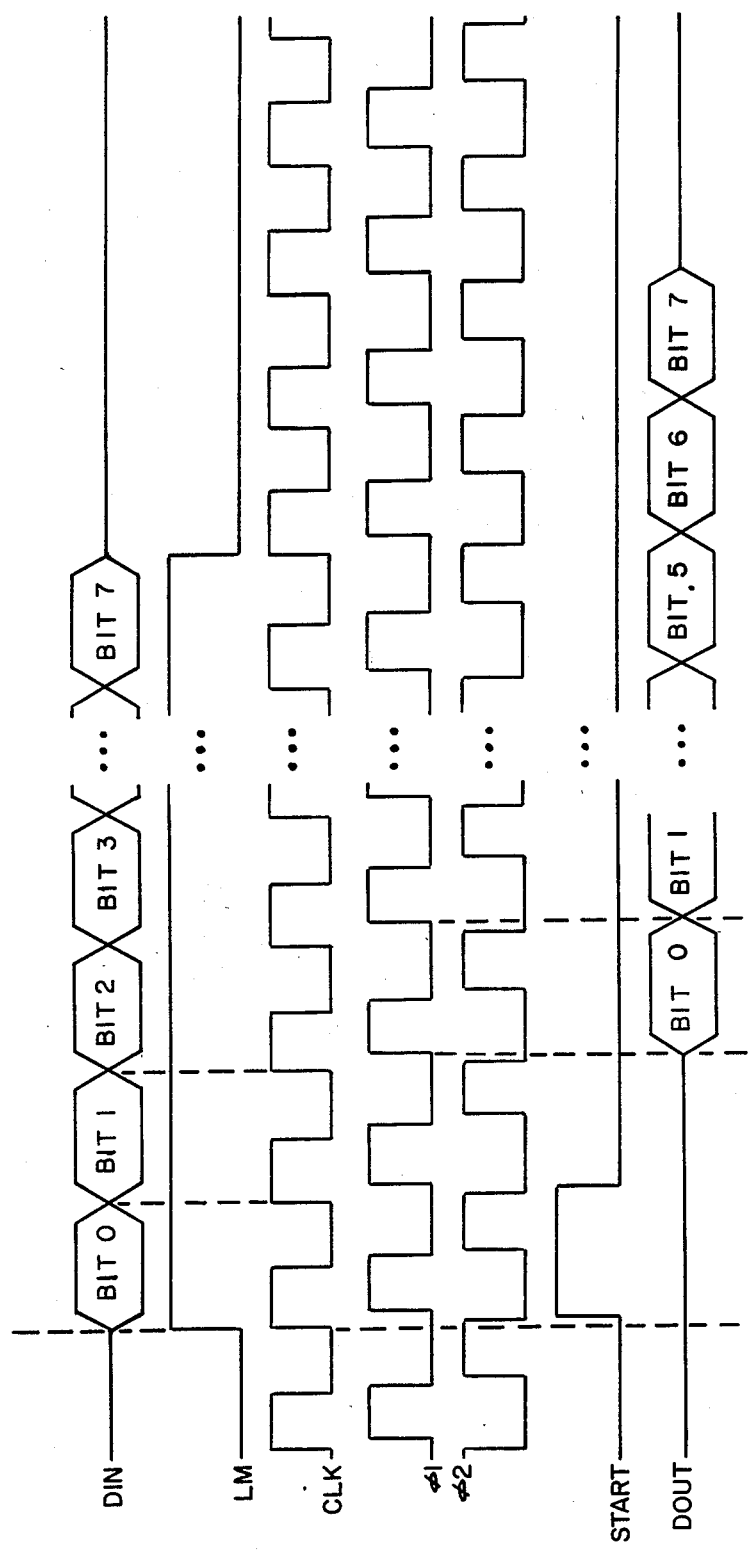
FIG. 4 is a timing diagram for control signals used in the synchronous bit-serial multiplication algorithm of the RS encoder shown in FIG. 2.

Thus, the RS encoder of FIG. 2 performs the above division process to obtain the check polynomial P(x), where FIG. 3 illustrates a block diagram of the interleaver for the check symbols with the programmable depth of interleaving assumed to be set to one, and FIG. 4 illustrates in a timing diagram the required control signals. In FIG. 2, R for $0 \leq i \leq 2t - 2$ and Q are m-bit registers. Initially, all registers are set to zero, and a control signal SL applied to gates $G_2$ and $G_4$ establish a first condition A.

The information symbols $c_{n-1}, \ldots, c_{2t}$ are fed into the quotient unit (division circuit) 22 of the encoder and also transmitted by the I/O unit from the encoder one under this first condition A by one. The quotient coefficients are generated and loaded into the Q register sequentially. The remainder coefficients are computed successively. Immediately after $c_{2t}$ is fed to the circuit, the control signal SL is set to turn off gates $G_2$ and $G_4$ and turn on gates $G_3$ and $G_6$ for a second condition B. At the very same moment $c_{2t-1}$ is computed and transmitted. Simultaneously, $c_i$ is computed and loaded into register R for $0 \leq i \leq 2t - 2$. Next, $c_{2t-2}, \ldots, c_0$ are transmitted from the encoder one by one. $c_{2t-2}, \ldots, c_0$ retain their values because the content of Q is set to zero when the upper gate $G_4$ is turned off to turn on gate $G_6$ in the second condition B.

The complexity of the design of an RS encoder results from the computation of the products $zg_i$ for $0 \leq i \leq 2t-1$. These computations can be performed in several ways, but none of them is suited to the pipeline processing structures usually seen in VLSI design. Fortunately, Berlekamp has disclosed a bit-serial multiplier algorithm that has the features needed to solve this problem. See his paper "Bit-serial Reed-Solomon encoders," IEEE Trans. Inform. Theory, Vol. IT-28, No. 6, pp. 869-874, November 1982, cited above. In this invention, Berlekamp's method is applied to the design of a (255,223) RS encoder with interleaving which can be implemented on a single VLSI chip.

In order to understand Berlekamp's multiplier algorithm, some mathematical preliminaries are needed. Toward this end, the mathematical concepts of the trace and a complementary (or dual) basis are introduced.

Definition 1: The trace of an element $\beta$ belonging to $GF(p^m)$, the Galois field of $p^m$ elements, is defined as follows:

$$Tr(\beta) = \sum_{k=0}^{m-1} \beta^{p^k}$$

In particular, for $p=2$, $$Tr(\beta) = \sum_{k=0}^{m-1} \beta^{2^k}$$

The trace has the following properties:
(1) $[Tr(\beta)]^p = \beta + \beta^p + \ldots + \beta^{p^{m-1}} = Tr(\beta)$ where $\beta \in GF(p^m)$. This implies that $Tr(\beta) \in GF(p)$, i.e., the trace is in the ground field $GF(p)$;
(2) $Tr(\beta+\gamma) = Tr(\beta) + Tr(\gamma)$, where $\beta, \gamma \in GF(p^m)$;
(3) $Tr(c\beta) = cTr(\beta)$ where $c \in GF(p)$;
(4) $Tr(1) = m \pmod{p}$.

Definition 2: A basis $\{\mu_j\}$ in $GF(p^m)$ is a set of $m$ linearly independent elements of $GF(p^m)$.

Definition 3: Two bases $\{\mu_j\}$ and $\{\lambda_k\}$ are said to be complementary or the dual of one another if $$Tr(\mu_j \lambda_k) = \begin{cases} 1, & \text{if } j = k \\ 0, & j \neq k \end{cases} \quad (5)$$

The basis $\{\mu_j\}$ is called the original basis, and the basis $\{\lambda_k\}$ is called the dual basis.

Lemma: If $\alpha$ is a root of an irreducible polynomial of degree $m$ in $GF(p^m)$, then $\{\alpha^k\}$ for $0 \leq k \leq m-1$ is a basis of $GF(p^m)$. The basis $\{\alpha^k\}$ for $0 \leq k \leq m-1$ is called the normal or natural basis of $GF(p^m)$.

Theorem 1: Every basis of a Galois field over $GF(2)$ has a complementary basis.

Corrolary 1: Suppose the bases $\{\mu_j\}$ and $\{\lambda_k\}$ are complementary. Then a field element $z$ can be expressed in the dual basis $\{\lambda_k\}$ by the expansion $$z = \sum_{k=0}^{m-1} z_k \lambda_k = \sum_{k=0}^{m-1} Tr(z\mu_k) \lambda_k \quad (6)$$

where $z_k = Tr(z\mu_k)$ is the kth coefficient of the dual basis.

Proof: Let $z = z_0 \lambda_0 + z_1 \lambda_1 + \ldots + z_{m-1} \lambda_{m-1}$. Multiply both sides by $\alpha^k$ and take the trace. Then by Definition 3 and the properties of the trace $$Tr(z\alpha^k) = Tr\left(\sum_{i=0}^{m-1} z_i(\lambda_i \mu_k)\right) = z_k \quad Q.E.D.$$

This corollary provides a theoretical basis for the new RS encoder algorithm.

For a more complete description of the Berlekamp bit-serial multiplier, refer to Berlekamp's paper, supra. The paper of Hsu, et al., supra, uses a simple example to illustrate the operation of Berlekamp's bit-serial multiplier algorithm. Both papers are incorporated herein by reference. The architecture of FIG. 2 is designed to implement a (255, 223) RS encoder using Berlekamp's multiplier algorithm, which can be quite readily realized on a single NMOS VLSI chip.

The main function of the encoder with a remainder and interleaver unit 15 will not be described. CLK is a clock signal, which in general is a periodic square wave. The information symbols are fed into the chip from the data-in pin DIN, bit by bit, and in interleaved sequence $A_1, B_1 \ldots E_1; A_2, B_2, \ldots E_2; A_{223}, B_{223}, \ldots E_{223}$. Similarly, the encoded check symbols out transmitted out from the data-out pin DOUT in interleaved sequence $A_1, B_1, \ldots E_1; A_2, B_2, \ldots E_2; A_{32}, B_{32}, \ldots E_{32}$. The control signal load mode (LM) is set to logic 1 while the information symbols are loaded bit by bit. Otherwise, LM is set to 0.

The input data and LM signals are synchronized by the CLK signal, while the operations of the circuit and output data signal are synchronized by two nonoverlapping clock signals $\phi 1$ and $\phi 2$ generated in a control unit 21. The timing diagram of DIN, LM, CLK, $\phi 1$, $\phi 2$, START, and DOUT signals are shown in FIG. 4. The delay of DOUT with respect to DIN is due to the input and output flip-flops, $F_I$ and $F_O$. The circuit in FIG. 2 is divided into four units besides the control unit 21.

Each unit is discussed in the following:

(1) Quotient Unit: In the quotient unit 22 Q is a 7-bit shift register with reset. R represents an 8-bit buffer register with feedback $T_f$ and parallel load. The parallel load operation of R is controlled by a load control signal LD. Registers R and Q store the currently operating coefficient and the next coefficient of the quotient polynomial, respectively. $z_i$ for $0 \leq i \leq 7$ are loaded into register R every eight clock cycles. Immediately after all 223 information symbols have been fed into the circuit, a control signal SL changes to logic 0. Thenceforth, the contents of the registers Q and R are set to zero so that the check symbols generated in the product unit 23 in cooperation with the remainder unit 25 sustain their values in the remainder unit which also provides the important interleaving function.

(2) Product Unit: The product unit 23 is used to compute $T_f, T_{31}, \ldots, T_0$. This circuit is realized by a programmable logic array (PLA) circuit. Since $T_0 = T_{31}$, $T_1 = T_{30}, \ldots, T_{15} = T_{17}$, only $T_f, T_{31}, \ldots, T_{17}$ and $T_{16}$ are actually implemented in a standard PLA circuit. $T_0, \ldots, T_{15}$ are connected directly to $T_{31}, \ldots, T_{17}$, respectively. A standard PLA circuit has the advantage over other circuits of being easy to reconfigure.

(3) Remainder Unit: The remainder unit 25 without interleaving is used to store the coefficients of the remainder during the division process. In FIG. 3, $S_i$ for $0 \leq i \leq 31$ are 8-bit shift registers with reset. Addition in the circuit is a modulo 2 addition or the EXCLUSIVE OR operation. While $c_{32}$ is being fed to the circuit $c_{31}$ is being computed and transmitted sequentially from the circuit. Simultaneously, $c_i$ is computed and then loaded into $S_i$ or $0 \leq i \leq 31$. Then $c_{31}, \ldots, c_0$ are transmitted out of the encoder bit by bit. For interleaving, a shift register $S_{31}$ is added, and N similar shift registers are included in a column, where N is a number specifying the depth of interleaving. N=5 is this exemplary embodiment of the invention.

(4) I/O Unit: The I/O unit 24 handles the input/output operations. In FIG. 2, both $F_0$ and $F_1$ are flip-flops. A gate (pass) transistor $G_1$ controlled by $\phi 1$ is inserted before flip-flop $F_1$ for the purpose of synchronization. A gate transistor $G_2$ passes the data into an output terminal DOUT. The flip-flop $F_0$ is inserted before the output terminal for synchronization. Control signal SL selects whether a bit of an information symbol or a check symbol from the remainder and interleaver unit 25 is to be transmitted.

(5) Control Unit: The control unit 21 in FIG. 2 generates the necessary control signals. This unit is further divided into three parts. The first part of the control unit is used to generate two overlapping clock signals $\phi 1$ and $\phi 2$ from CLK. The second part is used to generate control signals START and SL. The third part is a divide-by-8 binary counter. This counter generates the LD signal to load $z_i$'s into the buffer register R. The START signal resets all registers and the binary counter before the encoding process begins for a frame of information symbols.

The circuit accepts one bit of an information symbol, transmits one bit of the encoded code, and performs one step of Berlekamp's algorithm in one time unit. Immediately, after all of the information symbols are received by the encoder for a frame, the check symbols are available in the remainder unit. After transmitting the check symbols, the encoder is ready to process the next frame. In this invention, the check symbols just generated are shifted down one register position. When all five registers have been filled for an interleaving depth of 5, the check symbols are transmitted in sequence, one column of registers at a time, thus achieving the desired interleaving.

Since a frame of data contains 255 symbols, the computation of a complete encoded frame requires 255 "symbol cycles." A symbol cycle is the time interval needed to execute a complete cycle of Berlekamp's algorithm. Since a symbol has 8 bits, a symbol cycle contains 8-bit cycles. Here a bit cycle is defined to be the time interval needed to execute one step of Berlekamp's algorithm. In this design, a bit cycle requires one period of the clock cycle.

Having described the architecture of a (255,223) RS encoder using the Berlekamp serial multiplier algorithm with reference to FIG. 2, assuming only shift registers $S_o$ through $S_{30}$ for operation without interleaving (a shift register $S_{31}$ not being necessary), its operation with shift registers $S_{i,j}$ will now be described with a shift register $S_{31}$ employed in the shift register $j=1$ as well as $j=2, 3, 4$, and 5.

A block diagram of the remainder and interleaver unit of the present invention shown in FIG. 3 is used to store the coefficients of the remainder during the division process of up to five successive frames and perform the interleaving operation of the check symbols 1-32. The blocks labeled $S_{i,j}$ for $0 \leq i \leq 31$, $1 \leq j \leq 5$ are 8-bit shift registers. The addition used in the circuit during the remainder calculations for each frame is a modulo 2 addition or Exclusive-OR operation.

"Turn" and "No-turn" control signals from an external source, such as manual switches, are used to program the interleaving depth. The "No-turn" signals are the logical complement of the corresponding "Turn" signals. For example, if "Turn 2" equals 1 and all other "Turn" signals equal 0, then obviously the signal "No-turn 2" will equal 0 and all other "No-turn" signals will equal 1. These states of control signals will turn off transistors $T_2$, $T_3$, $T_6$, $T_8$, $T_9$ and turn on all other transistors in the corresponding positions in FIG. 3 on. Also transistors $T_1$, $T_4$, $T_5$, $T_7$, $T_{10}$, $T_{11}$, $T_{12}$ will be turned off. Since transistor $T_1$ is off, the registers $S_{i,1}$ can only shift down to $S_{i,2}$. Then since transistor $T_3$ is on because Turn 2 equals 1, the output of $S_{1,2}$ is shifted with $S_{i,1}$ via modulo 2 adders $I_i$. Thus, data can be transferred from registers $S_{i,1}$'s to $S_{i,2}$'s for $0 \leq i \leq 31$.

The outputs of registers $S_{i,2}$'s for $0 \leq i \leq 30$, are sent to the inputs of modulo 2 adders by conductors $L_i$'s for $1 \leq i \leq 31$. Since transistor $T_4$ and all transistors in its corresponding position in FIG. 3 are off, outputs of $S_{i,2}$'s cannot be sent to $S_{i,3}$'s for $0 \leq i \leq 31$, which means only a depth of 2 interleaving operations is allowed in this manner. The depths of 3, 4 or 5 interleaving can be carried out similarly.

The interleaved information symbols are fed into the interleaver shown in FIG. 2 serially through the data-in pin, DIN. Similarly, the encoded frame of interleaved information symbols followed by interleaved check symbols are transmitted out of the interleaver 25 sequentially from the data-out pin, DOUT. The control signal SL is set to logic 1 when the information symbols are loaded into the chip. After this, SL is set to logic 0. The control signal "START" resets a 3-bit word counter in the chip before the encoding process begins. The "Turn" signals are used to program the interleaving depth. For the interleaving depth of 5, the partial remainders for each interleaved symbol is introduced at the first level register, as the information symbols $A_i$, $B_i$, $C_i$, $D_i$ and $E_i$ are processed, the partial remainders circulate in the registers until $A_{223}$, $B_{223}$, $C_{223}$, $D_{223}$ and $E_{223}$ have been processed. At that point, the five corresponding final remainders (check symbols) are stored in the five respective levels of the remainder and interleaving unit 25 shown in FIG. 3. Those buffer registers are then read out in sequence by column to interleave the check symbols. In that manner, the interleaved check symbols are associated with the information symbols so they may be deinterleaved at the receiver after the Viterbi inner decoder.

From the foregoing, it is evident that the main function of the remainder and interleaver unit 25 of FIG. 2 is initially to compute the 32 check symbols for each five successive frames of 223 symbosl each, and to store the check symbols in successive ones of the five registers in the remainder and interleaver unit 25 shown in FIG. 3. As the five encoded frames are processed in the RS (255,223) encoder, symbol by symbol of interleaved information symbols, the circuit shown in FIG. 3, the check symbols are stored in rows of registers. When the check symbols are transmitted, they are interleaved by the way they are transmitted serially, column by column of registers in sequence instead of from rows of registers. At the receiver, they are then received and stored in sequence in registers organized for deinterleaving. Thus, it is clear that the 223 information symbols of the frames must also be interleaved at the transmitter. Once the 223 symbols of each frame are transmitted in interleaved form, namely $A_1$, $B_1$, $C_1$, $D_1$, $E_1$;

$A_2$, $B_2$, $C_2$, $D_2$, $E_2$; ... $A_{223}$, $B_{223}$, $C_{223}$, $D_{223}$, $E_{223}$, the interleaved check symbols follow for a block of five frames.

At the receiver, the deinterleaver 14 receives and stores the interleaved data frames and interleaved check symbols in two arrays of five registers in the same order they were transmitted so that when read out in sequence from the two arrays of five registers separately, the deinterleaved frames of data symbols are each followed by their deinterleaved check symbols for RS outer code decoding. Thus, the Reed-Solomon outer decoder 15 is able to process each frame of 223 symbols in sequence with its corresponding check symbols.

Figure 5:
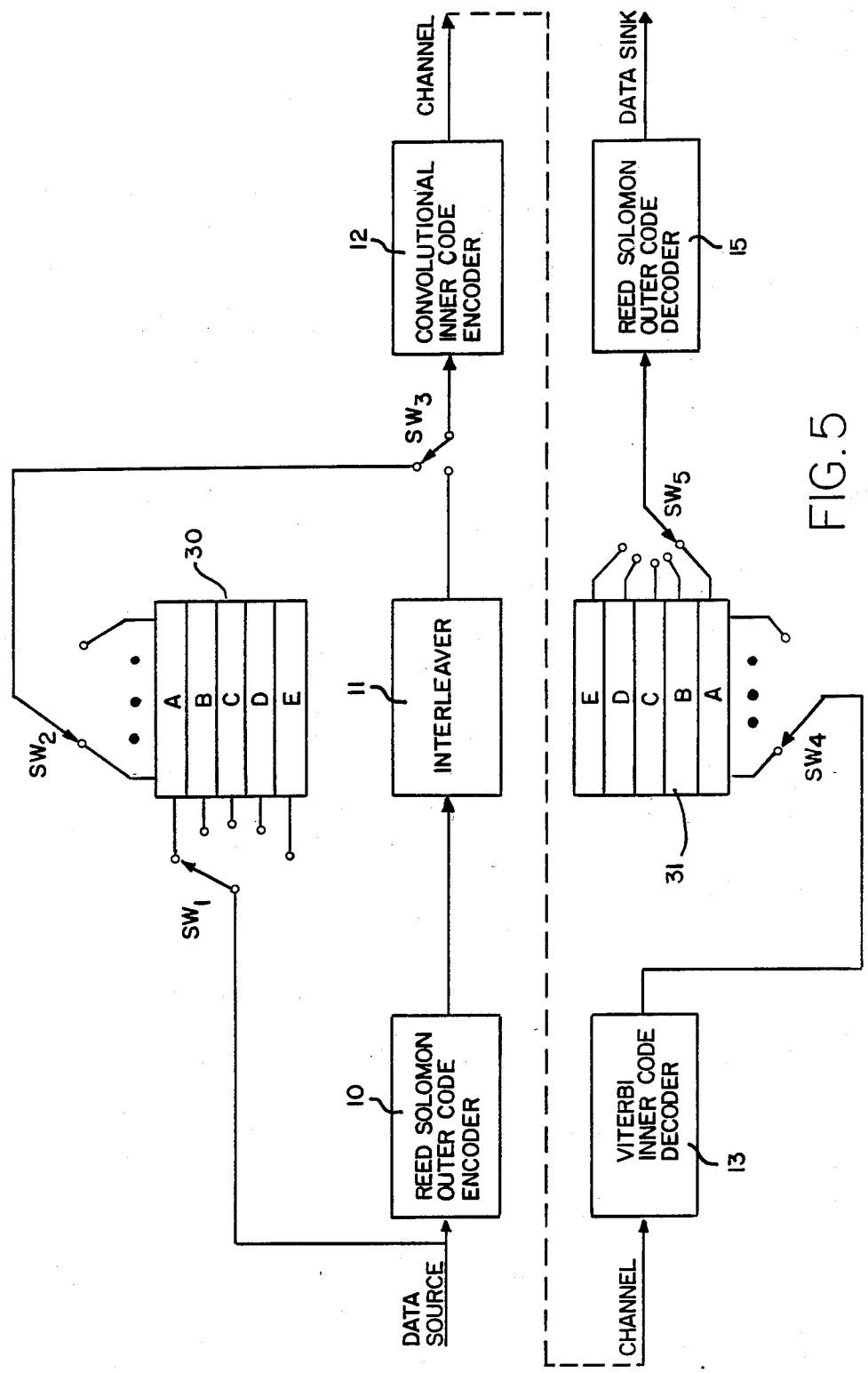
FIG. 5 illustrates in a block diagram the organization of an alternative embodiment having an interleaver for information symbols as shown and an interleaver for parity check symbols implemented in the same manner as shown in FIG. 3 for the embodiment of FIG. 2, and a deinterleaver for information and check symbols that is the inverse of the interleaver for information symbols.

FIG. 5 illustrates an alternative arrangement in which the information of the data source are not interleaved, and the five levels of the RS outer code encoder 10 are operated in a noncirculating manner. As each frame of 223 symbols is processed and stored in an array 30 of five registers, the 32 check symbols are developed in the register $S_{0,1}$ through $S_{31,1}$ and then shifted into the next register $S_{0,2}$ through $S_{31,2}$, until all five registers are loaded. They are then read out sequentially by column to interleave the check symbols, but first the five frames of information symbols stored in the array 30 of five registers A, B, ..., E, is read out sequentially by column to interleave on the chip the information symbols, using multiplexing switch $SW_1$ to store, multiplexing switch $SW_2$ to read out, and switch $SW_3$ to read out the interleaved information frames first and then the interleaved check symbols. Multiplexing switches $SW_4$ then effect deinterleaving by simply inverting the process at the receiver in an array 31 of storage registers A', B', C', D', and E', each having a capacity to store 223 symbols of data and 32 check symbols. The 255 interleaved symbols are stored in the same manner as read from the array of registers 30, thus inverting the interleaving effected in the transmitter to deinterleave the data and check symbols.

While multiplexing switches $SW_1$, $SW_2$ and $SW_3$ are shown to illustrate interleaving blocks of data symbols, it would be possible to simply provide five frame registers organized in the same way as in FIG. 3 for the check symbols, with the serial frame of 223 symbols entering into the first (top) register in series, and transferring down to the next register in parallel at the start of the next frame of 223 symbols until all five registers are filled by shifting down from the top. To then transmit the frames in interleaved form, the symbols are read out as described for the check symbols. These interleaving frame registers could then be programmed to the depth of desired interleaving as in the circuit of FIG. 3. A similar arrangement may be used to fill the deinterleaver array of five registers by entering the symbol sets of $A_i$, $B_i$, $C_i$, $D_i$ and $E_i$ in sequence and shifting them through in serpentine fashion until all five sets of 223 symbols have been distributed into the proper registers consituting a block of symbols. The same would be done for the check symbols. Each block may then be read out serially from the separate registers. Here again, the multiplexing switches $SW_4$ and $SW_5$ may by implemented electronically as suggested by the organization just described for interleaving at the transmitter.

To facilitate timing at both the transmitter and receiver, ample time between blocks may be provided to complete interleaving and deinterleaving, or two arrays of registers may be provided at both the transmitter and receiver so that one may start filling before the other has completed its function.

Since an interleaver organized as just described with reference to FIG. 5 would require considerable space on a VLSI chip, it would be preferable to preinterleave at the source the block of data to be encoded and transmitted, while at the same time entering the interleaved information symbol frames for generation and interleaving of the check symbols. The interleaved symbol frames of a 5×223 block would be transmitted with the block of 5×32 interleaved check symbols. While reference has been made repeatedly in this discussion of FIG. 5 to a depth of 5 interleaving, it is evident that other interleaving depths may be provided, and that by use of electronic switches, the depth of interleaving may be programmable.

Figure 6:
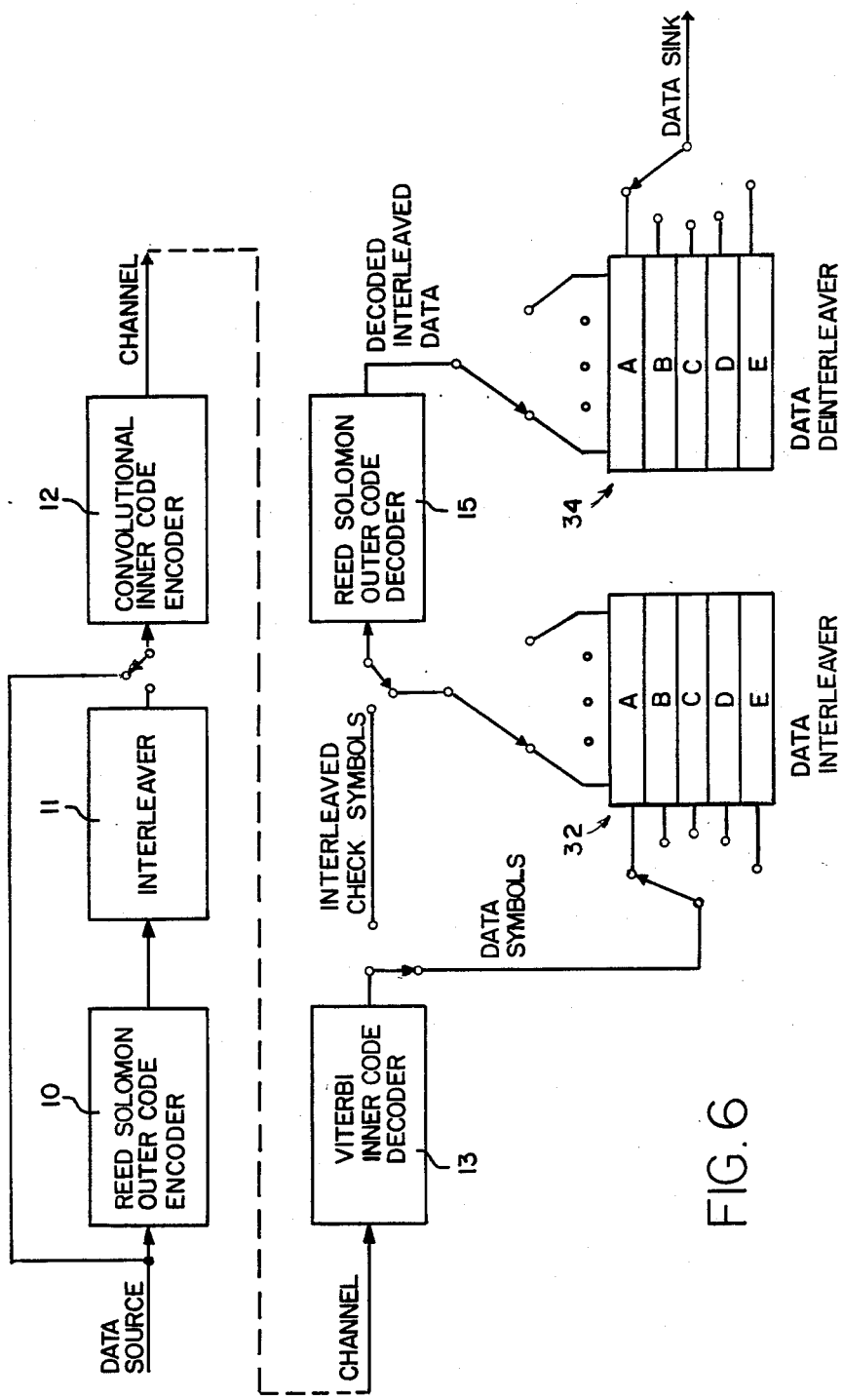
FIG. 6 illustrates yet another alternative embodiment of the present invention which sifts the burden of data interleaving and deinterleaving to the receiver.

Still another alternative is illustrated in FIG. 6 in which an RS outer code encoder 10 processes data from a source that, as in FIG. 5, is not preinterleaved, and output check symbols are generated in sequence, with the check symbols stored in separate registers of the interleaver 11 arranged in a column. Interleaving the parity check symbols is then accomplished in the interleaver 11 by reading the check symbols out from the registers in interleaved form, i.e., column by column. The sequential frames of the 223 information symbols plus 32 interleaved check symbols are then encoded with the convolutional inner code for transmission over a channel. The convolutional inner code is decoded by the Viterbi inner decoder 13, as before, to combat noise in the channel. To combat any bursts of errors treated in the Viterbi inner decoder, the 223 information symbols (which are not interleaved are first interleaved in an array 32 of registers organized in the same manner as the array 30 of FIG. 5. Then the interleaved information symbols are concatenated with the 32 interleaved parity check symbols at the input to the Reed-Solomon outer code decoder 15 to detect and correct errors and deletions. The corrected data out of the decoder 15 is then deinterleaved in an array of registers 34 organized as the array 14 in FIG. 5. This alternative of the invention shown in FIG. 6 has the advantage of placing only the essential functions at the transmitter by transferring the function of interleaving the frames of information symbols to the receiver.

Although particular embodiments of the invention have been described and illustrated herein for high data rate (high throughput) and/or VLSI implementation for small space and weight, it is recognized that modifications and variations may readily occur to those skilled in the art. Consequently, it is intended that the claims be interpreted to cover such modifications and variations.

We claim:

1. In a concatenated Reed-Solomon/convolutional encoding system for transmitting data symbols from a source with a Reed-Solomon outer code and a convolutional inner code, said data symbols being grouped in frames having a fixed number of said data symbols for Reed-Solomon outer code encoding, whereby a fixed number of parity check symbols are generated for each frame, apparatus comprising means for encoding each of a programmable number of successive frames grouped in a block of data symbols with said Reed-Solomon outer code to generate said number of parity check symbols for each frame of a block, comprised of a bit serial Berlekamp multipler having parallel storage for partial remainders in an array of registers $S_i$ for $1 \leq i \leq n$ to develop parity check symbols $A_i$, $B_i$ ..., $N_i$ for $1 \leq i \leq n$, where N is the programmable number of frames in a block, and n is the number of check symbols generated for each of said frames in a block, whereby said array has a row of separate registers for developing partial remainders into parity check symbols for each of said programmable number N of successive frames in a block and storing said fixed number n of parity check symbols in separate registers for each of said frame, and means for reading out check symbols in interleaved sequence of $A_1, B_1, \ldots, N_1; A_2, B_2, \ldots, N_2; \ldots; A_n, B_n, \ldots, N_n$, means for programming the number of frames grouped in a block for encoding with said Reed-Solomon outer code by programmably setting said number of parallel storage registers to be active in storing parity check symbols, means for encoding each of said frames and associated interleaved parity check symbols of said block with a convolutional inner code for transmission through a channel, means for receiving said frames and associated interleaved parity check symbols of said block and for decoding said convolutional code of said block with a Viterbi maximum likelihood decoder, and means for matching each frame of symbols in a block of frames encoded with said Reed-Solomon outer code with said associated check symbols for Reed-Solomon outer code decoding.

2. Apparatus as defined in claim 1 wherein said data symbols from a source grouped into a programmable number of frames in each successive block are preinterleaved block by block, and said means for Reed-Solomon outer code encoding of each of a programmed number of successive frames grouped in a block generates interleaved parity check symbols for said frames in said block, and wherein said means for matching each frame of symbols in a block of frames received by said receiving means is comprised of means for deinterleaving said parity check symbols and deinterleaving said frames of information symbols in each block before decoding said outer code in said Reed-Solomon decoder.

3. Apparatus as defined in claim 1 wherein frames of a programmed number of frames of data symbols from said source are not interleaved block by block prior to encoding with said Reed-Solomon outer code, further comprising means for interleaving said frames of data, and means for combining the resulting interleaved data with interleaved parity check symbols for encoding with a convolutional inner code prior to transmission through said channel, and means for deinterleaving said data symbols and said parity check symbols prior to decoding said Reed-Solomon outer code following said means for receiving both data symbols and parity check symbols block by block and for decoding said convolutional code of said block.

4. Apparatus as defined in claim 1 wherein frames of a programmed number of frames of data symbols from said source are not interleaved block by block prior to encoding with said Reed-Solomon outer code, further comprising means for interleaving said data symbols of said frames from said source block by block following said means for receiving data symbols and check symbols of each block and decoding said convolutional code of each block, means for combining the resulting interleaved data with interleaved check symbols block by block for outer code decoding with a Reed-Solomon decoder, and means for deinterleaving the resulting decoded Reed-Solomon outer code.

* * * * *